(12) United States Patent
Watanabe

(10) Patent No.: US 6,448,104 B1
(45) Date of Patent: *Sep. 10, 2002

(54) CMOS TYPE SOLID IMAGING DEVICE

(75) Inventor: Takashi Watanabe, Soraku-gun (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/296,344

(22) Filed: Apr. 22, 1999

(30) Foreign Application Priority Data

Apr. 22, 1998 (JP) .......................................... 10-111222

(51) Int. Cl.$^7$ .............................................. H01L 21/00
(52) U.S. Cl. .......................... 438/60; 438/75; 438/298; 438/312; 257/292
(58) Field of Search .................... 257/292; 438/197, 438/199, 216, 287, 29, 47, 191, 312, 299, 298, 57, 60, 200, 237, 73, 75

(56) References Cited

U.S. PATENT DOCUMENTS

| | | | | |
|---|---|---|---|---|
| 4,341,571 A | * | 7/1982 | Hiss et al. ..................... 148/1.5 |
| 4,603,471 A | * | 8/1986 | Strain ........................ 29/576 B |
| 5,376,568 A | * | 12/1994 | Yang ............................. 437/40 |
| 5,441,900 A | * | 8/1995 | Bulucea et al. ................ 437/24 |
| 5,486,482 A | * | 1/1996 | Yang ............................. 437/34 |
| 5,516,714 A | * | 5/1996 | Kim .............................. 437/53 |
| 5,518,938 A | * | 5/1996 | Yang ............................. 437/34 |
| 5,547,895 A | * | 8/1996 | Yang ............................. 437/57 |
| 5,602,407 A | * | 2/1997 | Washkurak et al. ......... 257/223 |
| 5,637,900 A | * | 6/1997 | Ker et al. .................... 257/355 |
| 5,691,225 A | * | 11/1997 | Abiko .......................... 437/57 |
| 5,702,988 A | * | 12/1997 | Liang .......................... 438/238 |
| 5,783,470 A | * | 7/1998 | Rostoker .................... 438/253 |
| 5,818,091 A | * | 10/1998 | Lee et al. .................... 257/382 |
| 5,898,196 A | * | 4/1999 | Hook et al. ................. 257/292 |
| 6,163,476 A | * | 12/2000 | Marr et al. ................. 365/154 |
| 6,169,318 B1 | * | 1/2001 | McGrath .................... 257/445 |
| 6,184,557 B1 | * | 2/2001 | Poplevine et al. .......... 257/358 |
| 6,218,708 B1 | * | 4/2001 | Burr ........................... 257/372 |
| 6,218,895 B1 | * | 4/2001 | De et al. .................... 327/566 |

FOREIGN PATENT DOCUMENTS

JP  9-232555  9/1997

OTHER PUBLICATIONS

Dierickx; U.S. patent application Publication US 2002/0022309–A1; Publication Date Feb. 2002.*

* cited by examiner

*Primary Examiner*—Wael Fahmy
*Assistant Examiner*—Fernando Toledo
(74) *Attorney, Agent, or Firm*—Dike, Bronstein, Roberts & Cushman IP Group Edwards & Angell, LLP; David G. Conlin; Timothy Carter Pledger

(57) ABSTRACT

A solid imaging device including: a semiconductor substrate of a first conductivity types a layer of a second conductivity type formed on a surface of the semiconductor substrate, the layer at least including a photosensitive portion of the second conductivity type; and a MOS transistor of the second conductivity type coupled to the photosensitive portion, wherein the solid imaging device further includes a layer of the first conductivity type in at least a channel region of the MOS transistor of the second conductivity type, the layer of the first conductivity type having an impurity concentration which is higher than an impurity concentration of the semiconductor substrate, and wherein at least a portion of a boundary of the layer of the second conductivity type is in direct contact with the semiconductor substrate.

2 Claims, 9 Drawing Sheets

PRIOR ART

PRIOR ART

CMOS TYPE SOLID IMAGING DEVICE

BACKGROUND OF THE INVENTION

1. Field Of The Invention

The present invention relates to a solid imaging device which provides high sensitivity.

2. Description Of The Related Art

CMOS type image sensors, i.e., image sensors formed through a CMOS process, have been proposed. CMOS type image sensors are classified into: PPS (passive pixel sensors) for reading a signal charge which has been generated through photoelectric conversion in each pixel without alteration to the signal charge; and APS (active pixel sensors) for reading such a signal charge after having been amplified, the amplification occurring on a pixel-to-pixel basis. Both types of CMOS image sensors usually employ a photodiode (constituting a p-n junction) as a photoelectric conversion section.

In a PPS type CMOS image sensor, as shown in FIG. 9, a signal charge from a photodiode 5 is switched via a single MOS transistor 3, which is located within the same pixel, so as to be read onto a signal line 13 without being amplified. A signal for causing the switching of the MOS transistor 3 is supplied via a pixel selection clock line 11.

FIG. 10A shows a plan view of an actual pattern corresponding to the circuit diagram shown in FIG. 9. FIG. 10B shows a cross-sectional view taken along line A—A of FIG. 10A. FIG. 10C shows a cross-sectional view taken along line B—B of FIG. 10A. In FIG. 10A, the elements which correspond to any circuit elements shown in FIG. 9 (e.g., the photodiode 5) are indicated by the same reference numerals as used therein.

As seen from FIGS. 10B and 10C, the photodiode 5 for performing photoelectric conversion is constructed from an $n^+$ layer 130 formed on a p well 110, which in turn is formed on a $p^-$ semiconductor substrate 100. A p-n junction is formed at an interface between the $n^+$ layer 130 and the p well 110, where photoelectric conversion takes place. The $n^+$ layer 130 is divided into a portion 130a (the hatched portion in FIG. 10A) which substantially functions as a photosensitive portion (i.e., a photodiode) and a portion 130b which substantially functions as a source/drain of the MOS transistor 3. These portions 130a and 130b are usually formed in an integral manner. In the step of forming the $n^+$ layer 130 composing the photodiode 5, an $n^+$ layer 131 (which later becomes the source/drain of the MOS transistor 3) is formed, usually concurrently, on the p well 110 so as to be located at a predetermined distance from the $n^+$ layer 130. As a result, a channel 3a of the MOS transistor 3 is formed in the p well 110. By disposing the pixel selection clock line 11 above the channel 3a with an insulation layer (e.g., an oxidation film; not shown) interposed therebetween, and applying a predetermined voltage thereto, a switching operation of the MOS transistor 3 occurs. Thus, the MOS transistor 3 is activated or turned on so that a signal (charge) from the photodiode 5 is transmitted, via a contact formed in the source/drain $n^+$ layer 131, to a signal line 13 (not shown in FIG. 10A) which is formed so as to intersect the clock line 11.

On the other hand, an APS type CMOS image sensor requires a photoelectric conversion section, an amplification section, a pixel selection section, and a reset section to be formed in association with each pixel. Usually, three to four MOS transistors (T) are employed in addition to a photodiode (PD). FIG. 11 shows an exemplary structure of a portion of an APS type CMOS image sensor corresponding to two pixels, where three transistors (T) and one photodiode (PD) are incorporated (Mabuchi et al., "A ¼ INCH 330K PIXEL VGA CMOS IMAGE SENSOR", a technical report of the Institute of Image Information and Television Engineers, IPU97-13, March 1997"). As shown in FIG. 11, a photodiode 5, an amplification section 1. a reset section 2, a pixel selection section 3; a pixel selection clock line 11, a reset clock line 12, a signal line 13, and a supply line 14 are provided for each pixel.

FIG. 12A shows a plan view of an actual pattern corresponding to the circuit diagram shown in FIG. 11. FIG. 12B shows across-sectional view taken along line A—A of FIG. 12A. FIG. 12C shows a cross-sectional view taken along line B—B of FIG. 12A. In FIG. 12A, the elements which correspond to any circuit elements shown in FIG. 11 (e.g., the photodiode 5) are indicated by the same reference numerals as used therein. The photodiode 5 and three transistors 1 to 3 are formed so as to be aligned along the vertical direction in FIG. 12A.

As seen from FIGS. 12B and 12C, the photodiode 5 for performing photoelectric conversion is constructed from an $n^+$ layer 130 formed on a p well 110, which in turn is formed on a $p^-$ semiconductor substrate 100. A p-n junction is formed at an interface between the $n^+$ layer 130 and the p well 110, where photoelectric conversion takes place. In the step of forming the $n^+$ layer 130 composing the photodiode 5, $n^+$ layers 131 (which later become the respective source/drains of the MOS transistors 1 to 3) are formed, usually concurrently, on the p well 110 so as to be positioned at predetermined distances from the $n^+$ layer 130.

In FIGS. 9 to 12A, 12B, and 12C, the transistors 1, 2, and 3 are all n type MOS transistors, and the photodiode 5 is a p-n junction type diode. Such elements can be easily formed by using a standard CMOS process.

Now, the operation principles of a photodiode will be briefly discussed with reference to FIGS. 13A and 13B. Light which enters a p-n junction of a photodiode will be subjected to photoelectric conversion before it reaches an ingression depth Lp (on average), thereby generating electron/hole pairs. FIG. 13B shows the light intensity of the incident light against the depth as taken from the substrate surface. The amount of electrons which are effectively stored in the n surface layer as a signal charge is defined as a sum of the following three components:

(i) all of the electrons that have been generated in a depletion layer which is formed at the p-n junction interface;

(ii) a number of electrons equivalent to the number of the holes generated in a neutral region of the n layer that have reached, through diffusion, the end of the depletion layer formed at the junction interface; and (iii) a number of electrons generated in a neutral region of the p layer that have reached, through diffusion, the end of the depletion layer formed at the junction interface.

Therefore, enhancement of sensitivity can be most efficiently achieved by expanding the area of the depletion layer (component (i)). Component (ii) increases as the diffusion length of the holes within the n layer becomes larger than the n layer junction depth Xj (FIG. 13A). Component (iii) increases as the diffusion length of the electrons within the p layer increases. However, an increase in the diffusion length of the electrons in the p layer results in more eminent crosstalk occurring between adjoining pixels, resulting in problems such as decrease in the resolution and/or a flare phenomenon (i.e., influence of irradiation of intense light on other regions).

In the structures illustrated in FIGS. 9; 10A to 10C; 11; and 12A to 12C, the photodiode 5 is formed on the CMOS-process-based p well 110. In particular, in the APS type CMOS image sensor shown in FIGS. 11 and 12A to 12C, the area occupied by the transistors 1 to 3 must be minimized in order to secure a large photodiode area. Reducing the transistor dimensions requires increasing the p type impurity concentration in the p well 110. However, as shown in FIG. 13A, an increased p type impurity concentration in the p well 110 results in a decrease in the thickness Xdep of the depletion layer formed at the p-n junction interface.

In the following discussion, silicon is exemplified as a semiconductor substrate material.

In a common CMOS process, a p well concentration Np of about $1 \times 10^{17} \text{cm}^{-3}$ is used. Therefore, under the condition that the bias voltage Vb=3 V, the thickness of the depletion layer Xdep will be about 0.23 $\mu$m. The most recent CMOS process technique can reduce the junction depth Xj down to about 0.15 $\mu$m. In the case of about 550 nm, which is the wavelength within the visible spectrum that is best perceived by the human eye, the ingression depth Lp is about 1.5 $\mu$m. In other words, the depletion layer, which provides for the most efficient photoelectric conversion, only accounts for about 15% of the effective photoelectric conversion region, and the surface $n^+$ layer only accounts for about 10%. Therefore, a major portion of the effective photoelectric conversion region exists in the p well and the underlying p substrate region. This results in a decrease in sensitivity (in the case where the diffusion length of electrons within the p well is small) or a decrease in resolution and/or a flare phenomenon (in the case where the diffusion length of electrons within the p well is large).

FIG. 14 shows a conventional technique disclosed in Japanese Laid-open Publication No. 9-232555 for solving the aforementioned problems of the prior art techniques. The circuit shown in FIG. 14 is substantially the same as that shown in FIG. 11. For conciseness, like numerals are used for like elements. One feature of the circuit shown in FIG. 14 is the structure of the photodiode 5: specifically, a photoelectric conversion section (photosensitive portion) is formed on the n substrate 200. As a result, the signal charge (electrons) which has been generated in a portion deep into the semiconductor is discharged toward the n substrate 200, thereby greatly reducing the crosstalk between pixels. In addition, an n layer 220, having a lower concentration than that of an $n^+$ surface layer 230, is provided between the $n^+$ surface layer 230 and a p well 210 (which together form an n-p junction for photoelectric conversion), thereby reducing the n-p junction capacitance and increasing the detection sensitivity (i.e., the charge voltage conversion gain).

However, the aforementioned technique has the following problems: First, providing a p well on an n substrate and further providing an n transistor and an n-p junction photodiode therein leads to increased susceptibility to a longitudinal n-p-n bipolar action. In the photosensitive region, in particular, it is difficult to provide a contact from the substrate surface to a p well which is situated at an intermediate depth, because doing so will require extra wiring, which contradicts the order of securing a sufficiently large photodiode area. Therefore, the p well potential (e.g., the ground potential) may not be sufficiently fixed. This results in increased susceptibility to a longitudinal n-p-n bipolar action as well as malfunctioning.

Furthermore, in order to reduce the n-p junction capacitance of the photodiode, it is desirable that the concentration of the n layer 220 (which is interposed between the $n^+$ surface layer 230 and the p well 210) be equal to or smaller than the concentration of the p well 210. For example, under the conditions that $n^+$ layer concentration Ns=$1 \times 10^{21} \text{cm}^{-3}$; p well concentration Np=$1 \times 10^{17} \text{cm}^{-3}$; and bias voltage Vb=3 V, the n-p junction capacity Cj can be calculated as follows:

Cj=46 nF/cm$^2$ (if the n layer 220 is entirely omitted);
Cj=44 nF/cm$^2$ (if $N_n = 1 \times 10^{18} \text{cm}^{-3}$);
Cj=33 nF/cm$^2$ (if $N_n = 1 \times 10^{17} \text{cm}^{-3}$); and
Cj=14 nF/cm$^2$ (if $N_n = 1 \times 10^{16} \text{cm}^{-3}$).

Herein, it is assumed that the n layer 220 has a concentration $N_n$. As seen from the above calculation, a significant effect of reducing the junction capacitance emerges as the concentration $N_n$ becomes sufficiently smaller than the concentration $N_p$.

However, it is very difficult to form the n layer 220 so as to have a concentration $N_n$ which is equal to or smaller than the p well concentration $N_p$. Specifically, forming the n layer 220 by employing a single additional ion implantation step as disclosed in Japanese Laid-open Publication No. 9-232555 requires the concentrations of the respective layers to be selected in accordance with the intensity profiles shown in FIG. 15 (in which the concentration profiles of the respective layers are denoted by the same numerals as used in FIG. 14). Forming the n layer 220 with a concentration which is equal to or lower than that of the p well 210 requires implanting an n type impurity 220' at a slightly higher concentration than that of the p well 210 (for example, forming the n layer 220 with a concentration which is 1/10 times the concentration of the p well 210 requires implantation of an n type impurity 220' at a concentration which is 1.1 times that of the p well 210). In practice, however, substantial technical difficulties exist in achieving an n type impurity implantation at precisely 1.1 times that of the p well 210.

SUMMARY OF THE INVENTION

A solid imaging device according to the present invention includes: a semiconductor substrate of a first conductivity type; a layer of a second conductivity type formed on a surface of the semiconductor substrate, the layer at least including a photosensitive portion of the second conductivity type; and a MOS transistor of the second conductivity type coupled to the photosensitive portion, wherein the solid imaging device further includes a layer of the first conductivity type in at least a channel region of the MOS transistor of the second conductivity type, the layer of the first conductivity type having an impurity concentration which is higher than an impurity concentration of the semiconductor substrate, and wherein at least a portion of a boundary of the layer of the second conductivity type is in direct contact with the semiconductor substrate.

In one embodiment of the invention, at least a portion of the photosensitive portion of the second conductivity type is in contact with the semiconductor substrate.

In another embodiment of the invention, the layer of the second conductivity type further includes a further layer of the second conductivity type between the photosensitive portion of the second conductivity type and the semiconductor substrate, the further layer of the second conductivity type having an impurity concentration which is lower than an impurity concentration of the photosensitive portion, at least a portion of the further layer of the second conductivity type being in contact with the semiconductor substrate.

In still another embodiment of the invention, the impurity concentration of the layer of the first conductivity type is at least about ten times higher than the impurity concentration of the semiconductor substrate.

In still another embodiment of the invention, the impurity concentration of the further layer of the second conductivity type is at least about ten times higher than the impurity concentration of the semiconductor substrate.

In still another embodiment of the invention, the further layer of the second conductivity type is in contact with the layer of the first conductivity type, a boundary between the further layer of the second conductivity type and the layer of the first conductivity type being located outside the photosensitive portion.

In still another embodiment of the invention, the solid imaging device includes a plurality of said photosensitive portions and said further layers of the second conductivity type associated therewith, wherein one of the plurality of said further layers of the second conductivity type associated with one of the plurality of said photosensitive portions is formed independently from another of the plurality of said further layers of the second conductivity type.

In still another embodiment of the invention, the MOS transistor of the second conductivity type is operable to retain a level of a signal from the photosensitive portion.

In still another embodiment of the invention, the solid imaging device further includes one or more further MOS transistors of the second conductivity type associated with the photosensitive portion of the second conductivity type, wherein the MOS transistor of the second conductivity type and the further one or more MOS transistors of the second conductivity type are operable to amplify a level of a signal from the photosensitive portion.

In still another embodiment of the invention, the photosensitive portion of the second conductivity type is formed of the same material as that of a source/drain of the MOS transistor of the second conductivity type.

In still another embodiment of the invention, the photosensitive portion of the second conductivity type is formed of a material different from that of a source/drain of the MOS transistor of the second conductivity type.

In another aspect of the invention, there is provided a method for producing the aforementioned solid imaging device, wherein the solid imaging device further includes CMOS circuitry for controlling a signal from the photosensitive portion, the CMOS circuitry including: a well of the first conductivity type and a well of the second conductivity type, the wells being formed on the semiconductor substrate of the first conductivity type; a MOS transistor of the second conductivity type formed on the well of the first conductivity type; and a MOS transistor of the first conductivity type formed on the well of the second conductivity type, the method including a step of forming the layer of the first conductivity type and the well of the first conductivity type on a surface of the semiconductor substrate through a simultaneous layer formation process.

In yet another aspect of the invention, there is provided a method for producing the aforementioned solid imaging device, wherein the solid imaging device further includes CMOS circuitry for controlling a signal from the photosensitive portion, the CMOS circuitry including: a well of the first conductivity type and a well of the second conductivity type, the wells being formed on the semiconductor substrate of the first conductivity type; a MOS transistor of the second conductivity type formed on the well of the first conductivity type; and a MOS transistor of the first conductivity type formed on the well of the second conductivity type, the method including the steps of: forming the layer of the first conductivity type and the well of the first conductivity type on a surface of the semiconductor substrate through a simultaneous layer formation process; and forming the further layer of the second conductivity type and the well of the second conductivity type on the surface of the in semiconductor substrate through a simultaneous layer formation process.

Thus, the invention described herein makes possible the advantage of: providing a highly-sensitive and high-solution CMOS type solid imaging device having a photodiode section which attains a low flare level with a low dark current, without introducing a longitudinal bipolar structure in a photosensitive portion, and without the need to employ any special ion implantation step in addition to a usual CMOS process.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying Figures.

EXAMPLE 1

Figure 1:
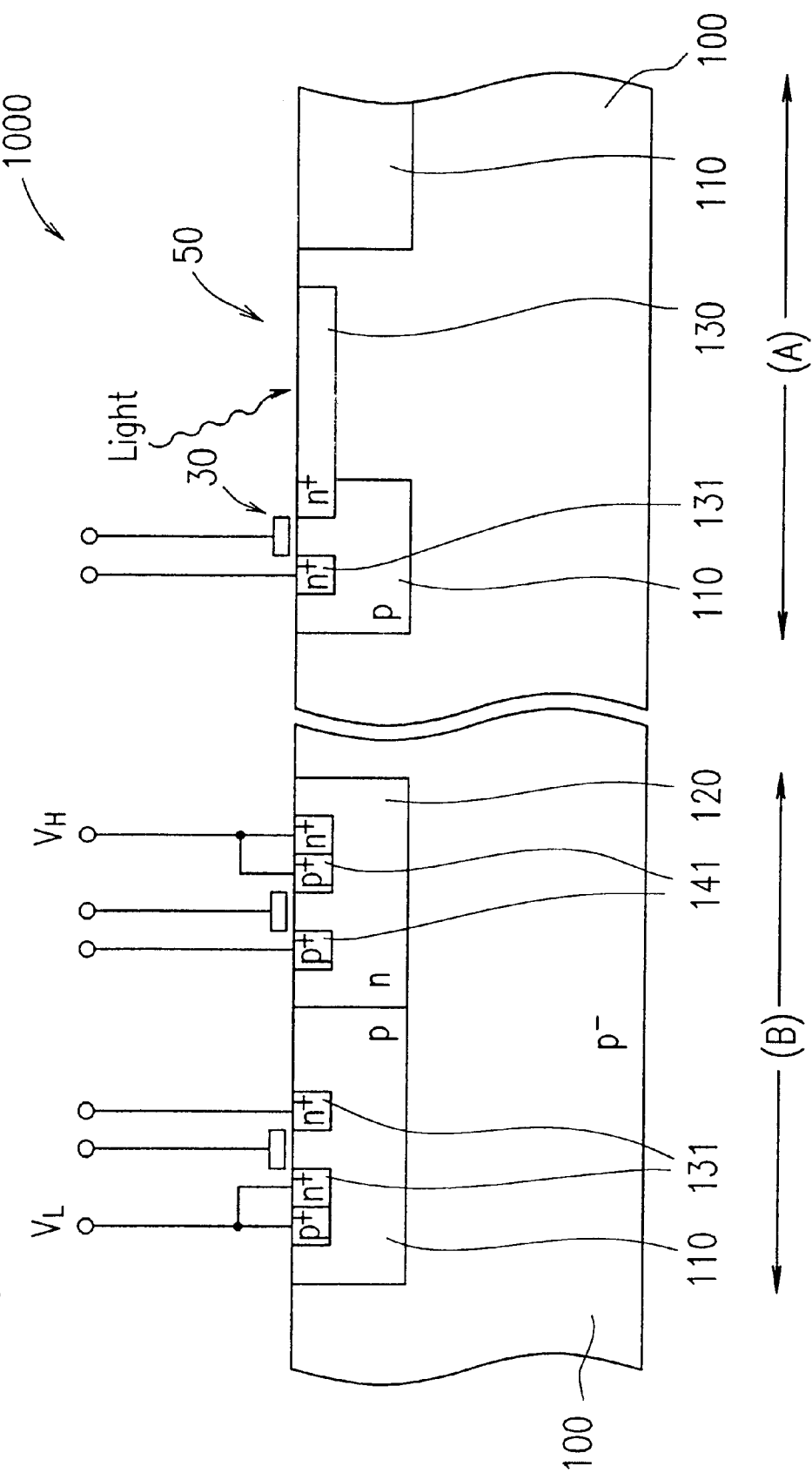
FIG. 1 is a cross-sectional view illustrating a CMOS type solid imaging device according to Example 1 of the present invention, showing in cross section a pixel section and surrounding CMOS circuitry.

FIG. 1 is a partial cross-sectional view illustrating a solid imaging device 1000 according to Example 1 of the present invention. In FIG. 1, a portion labeled as (A) represents a portion of a pixel section (i.e., a photosensitive region); a portion labeled as (B) represents, in part, surrounding CMOS circuitry which is usually provided at the periphery of the pixel section. Both of these portions are provided on the same p⁻ semiconductor substrate 100. The pixel section (A) includes, for example, photosensitive portions (photodiodes) 50 and n-MOS transistors 30 coupled to the photosensitive portions 50. A plurality of such photosensitive portions (photodiodes) 50 are arranged in a matrix shape so that each photosensitive portion defines one pixel. The surrounding CMOS circuitry (B) includes CMOS transistors which constitute a driving circuit for driving the respective pixels, for example.

In the pixel section (A) of the solid imaging device 1000 according to the present example, the p well 110 exists only under an n MOS transistor 30 (which controls the flow of a signal or charge from the photosensitive portion 50). That is, the p well 110 is substantially absent under the photosensitive portion 50 formed of the n⁺ layer 130, so that the photosensitive portion 50 directly adjoins the semiconductor substrate 100 at its boundary. Accordingly, a p-n junction for photoelectric conversion is formed between an n⁺ layer photosensitive portion 50 and a p⁻ semiconductor substrate 100.

In the present example, a portion of the n⁺ layer 130 also functions as the source/drain of the MOS transistor 30. However, the photosensitive portion -and the portion which functions as the source/drain of the MOS transistor that is coupled to the photosensitive portion need not be formed in an integral manner. The p well only needs to be formed in at least the channel region (i.e., a region between the source and the drain) of the MOS transistor which is coupled to the photosensitive portion.

On the other hand, in the surrounding CMOS circuitry (B), the p well 110 and an n well 120 are formed on the p⁻ semiconductor substrate 100, thereby constituting a so-called twin well structure. An nMOS transistor having a source and a drain formed of n⁺ layers 131 are provided in the p well 110. In the n well 120, a pMOS transistor having a source and a drain formed of p+ layers 141 is provided. Although the present example illustrates a solid imaging device having surrounding CMOS circuitry of a twin well structure, the present invention is also applicable to a solid imaging device with surrounding CMOS circuitry having a single well structure.

In the manufacturing process, the p well 110 in the pixel section (A) and the p well 110 in the surrounding CMOS circuitry (B) can be formed in the same layer formation step. A desired pattern of the p well 110 can be formed on the semiconductor substrate 100 through a technique similar to any conventional well formation process that employs photoresists or the like. The n⁺ layer 130 constituting the photodiode section and the n⁺ layer 131 constituting the source/drain of the n type transistor can be simultaneously formed in the same layer formation step, or separately formed in different steps.

Depending on the desired transistor characteristics and photodiode characteristics, the n⁺ layer 130 and the n⁺ layer 131 may be formed of the same material (having the same impurity concentration level) or different materials (having different impurity concentration levels).

Figure 2A:
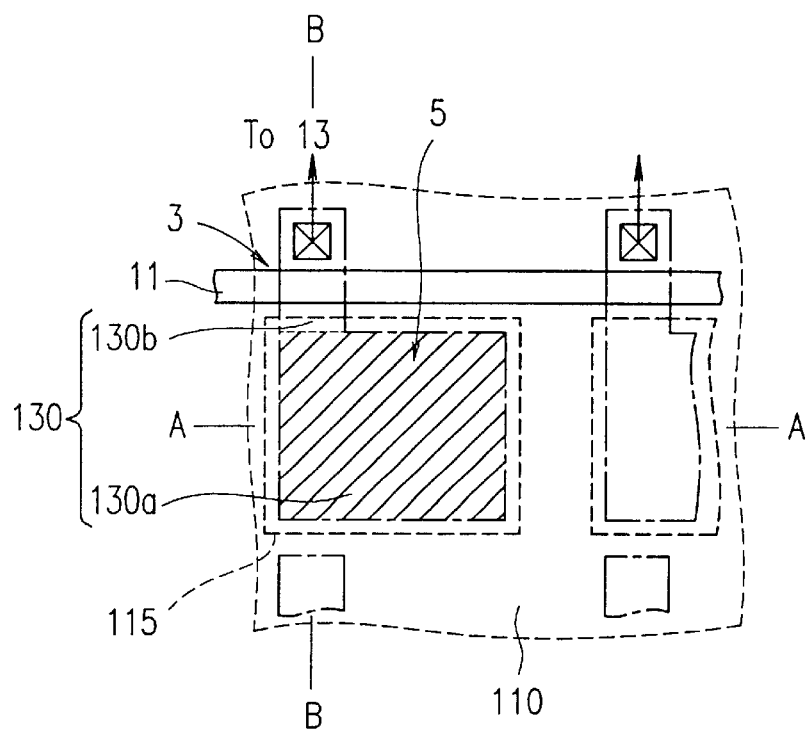
FIG. 2A shows a plan view of an actual pattern corresponding to a portion of a pixel section of the device according to Example 1 of the present invention, where the device is applied to a non-amplified pixel structure.
Figure 9:
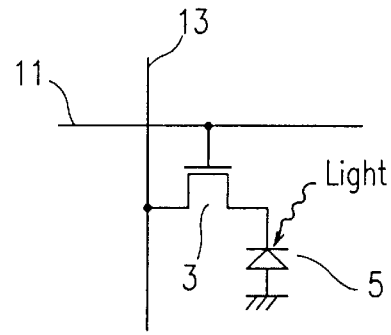
FIG. 9 is a circuit diagram illustrating a pixel section of a non-amplified CMOS type solid imaging device to which the present invention is applicable.
Figure 10A:
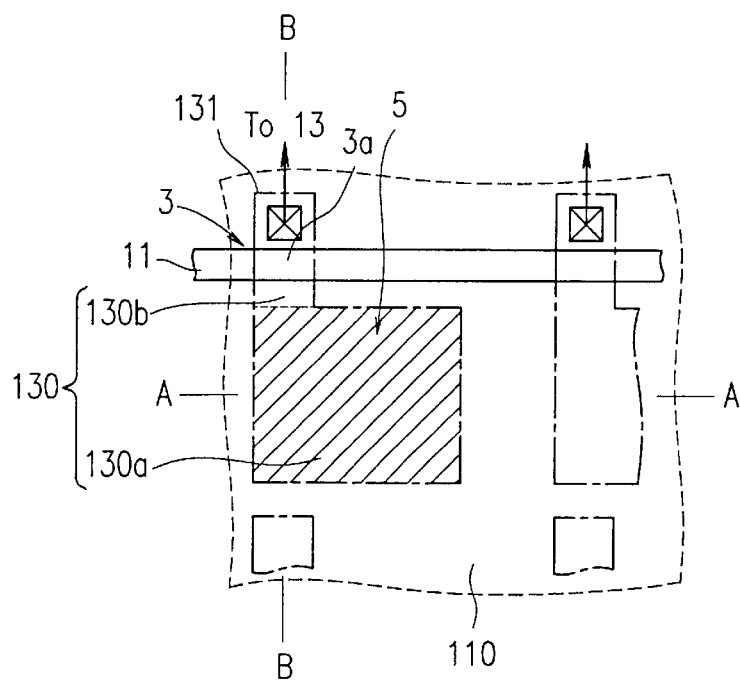
FIG. 10A shows a plan view of an actual pattern corresponding to a portion of a pixel section of a conventional non-amplified CMOS type solid imaging device.
Figure 10C:
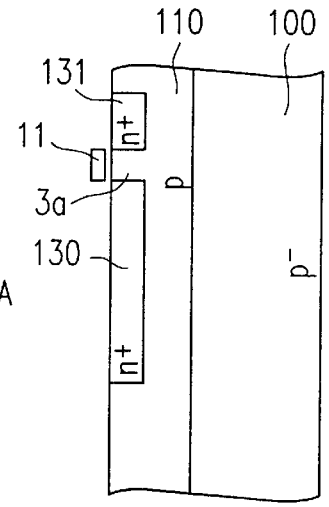
FIG. 10C shows a cross-sectional view taken along line B—B of FIG. 10A.
Figure 10B:
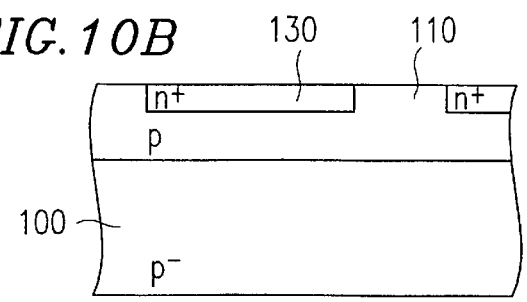
FIG. 10B shows a cross-sectional view taken along line A—A of FIG. 10A.

FIG. 2A shows a plan view of an actual pattern corresponding to a portion of a pixel section (corresponding to virtually one pixel) of the solid imaging device according to Example 1 of the present invention being applied to anon-amplified pixel structure as shown in FIG. 9. As seen from FIG. 2A, in accordance with the device of the present example, a pixel selection transistor 3, a photodiode 5, a pixel selection signal line 11, and a signal line 13 (cf. FIG. 9) are provided in association with each pixel. The same p well 110 as in the surrounding CMOS circuitry (FIG. 1) is formed in the vicinity of the transistor 3 (or at least in the vicinity of the channel region 3a thereof). However, the p well 110 is not formed in a region 115 underlying the photodiode 5. The regions 115 of the respective pixels in which the p well 110 is not formed are separated from or independent of one another, as can be more readily seen from FIG. 2B (a cross-sectional view taken along line A—A of FIG. 2A) and FIG. 2C (a cross-sectional view taken along line B—B of FIG. 2A). That is, the p well 110 is substantially absent under the n⁺ layer 130a (hatched region), which is coupled to the transistor 3 (which includes a p well at least in its channel region) via a portion 130b of the n⁺ layer 130, which acts as a source/drain of the transistor 3. Accordingly, at least a portion of the n⁺ layer 130 forming the photodiode section directly adjoins the low-concentration p substrate 100.

Alternatively, the above-mentioned non-amplified solid imaging device may be configured so that each pixel includes a plurality of MOS transistors.

Figure 3A:
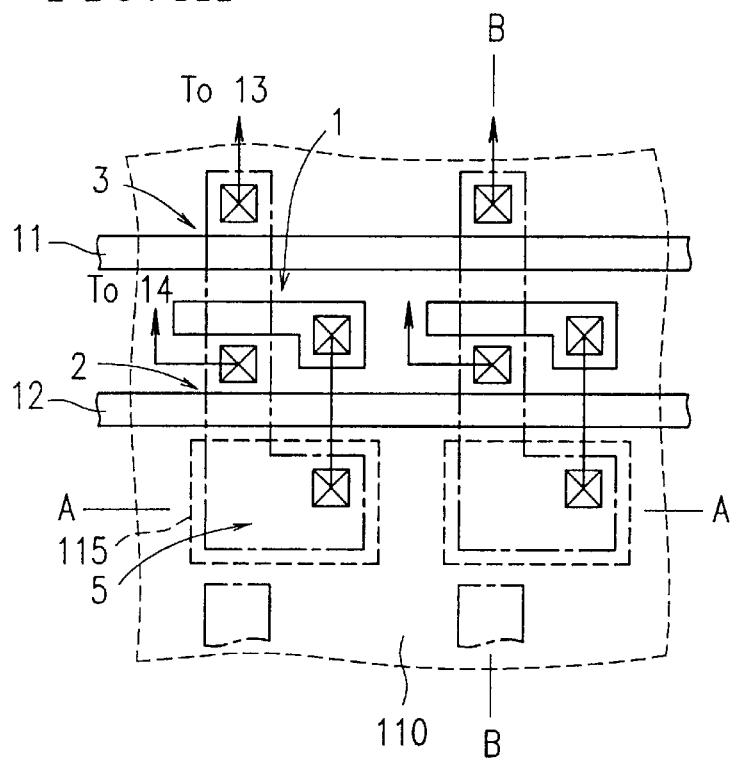
FIG. 3A shows a plan view of an actual pattern corresponding to a portion of pixel section of the device according to Example 1 of the present invention, where the device is applied to an amplified pixel structure.
Figure 3C:
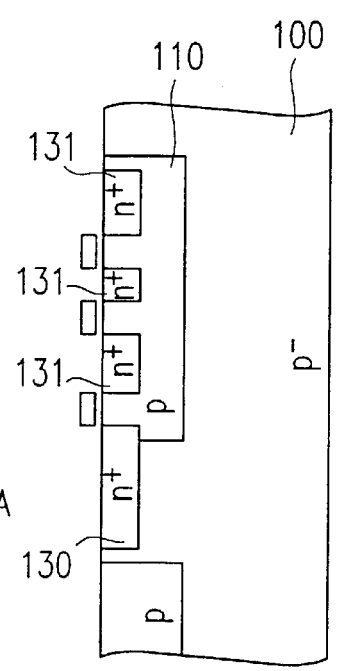
FIG. 3C shows a cross-sectional view taken along line B—B of FIG. 3A.
Figure 11:
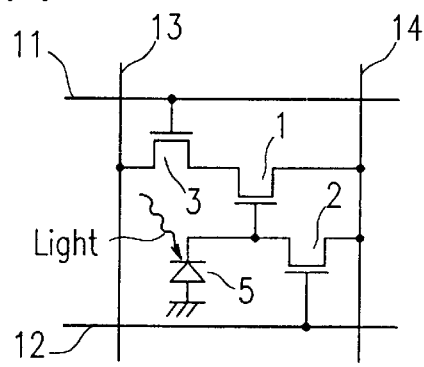
FIG. 11 is a circuit diagram illustrating a pixel section of an amplified CMOS type solid imaging 1device to which the present invention is applicable.
Figure 12A:
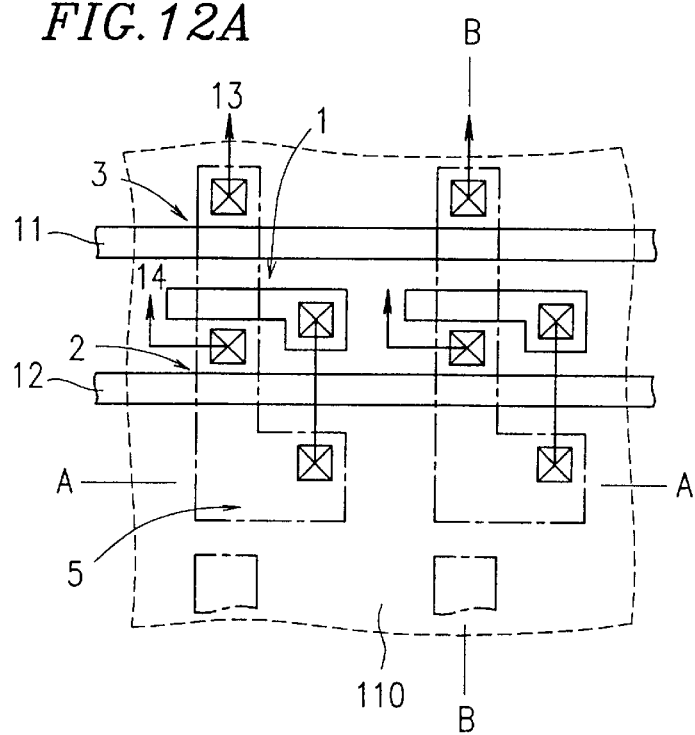
FIG. 12A shows a plan view of an actual pattern corresponding to a portion of a pixel section of a conventional amplified CMOS type solid imaging device.
Figure 12C:
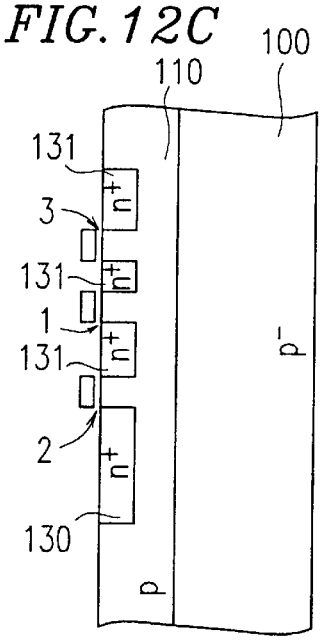
FIG. 12C shows a cross-sectional view taken along line B—B of FIG. 12A.
Figure 12B:
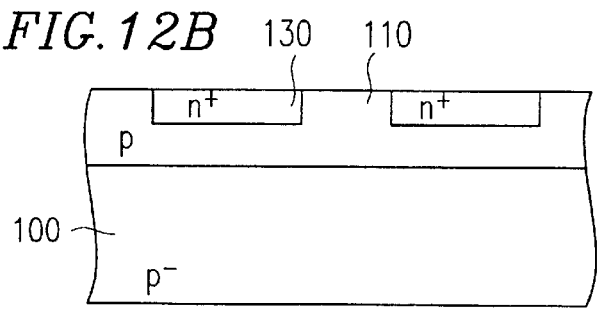
FIG. 12B shows a cross-sectional view taken along line A—A of FIG. 12A.
Figure 13A:
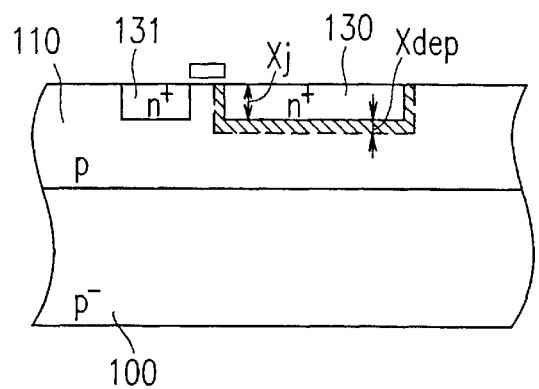
FIG. 13A is a cross-sectional view and a graph illustrating photoelectric conversion occurring in a photodiode section of a conventional CMOS type solid imaging device.
Figure 13B:
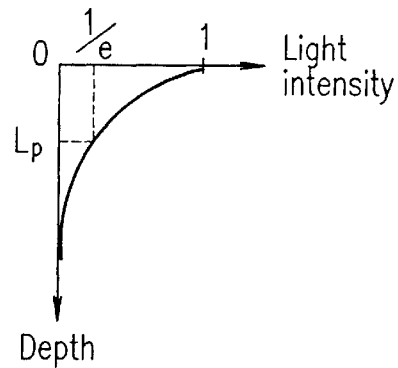
FIG. 13B shows the light intensity of the incident light against the depth as taken from the substrate surface.
Figure 14:
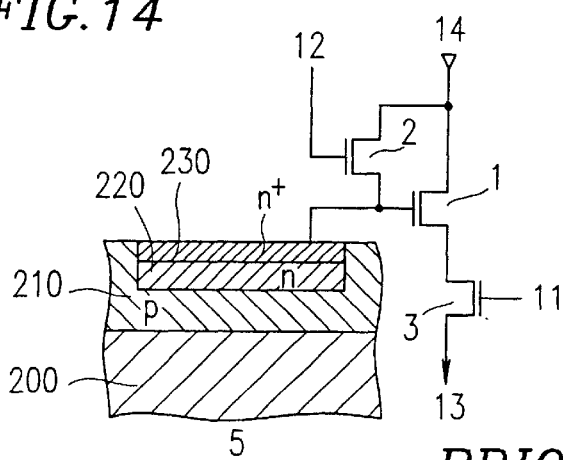
FIG. 14 is a diagram illustrating a pixel section of another conventional amplified CMOS type solid imaging device.
Figure 15:
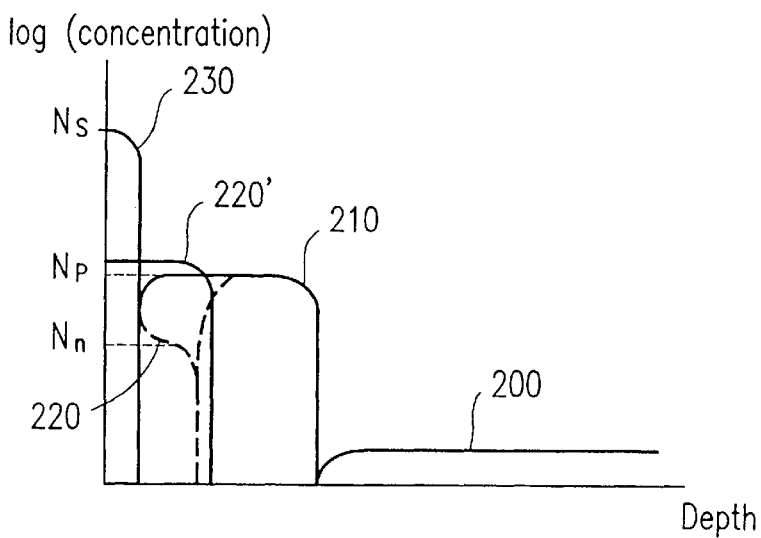
FIG. 15 is a graph of concentration profiles, illustrating a method for forming a photodiode section in the conventional CMOS type solid imaging device shown in FIG. 14.

FIG. 3A shows a plan view of an actual pattern corresponding to a portion of a pixel section (virtually corresponding to two pixels) of the device according to Example 1 of the present invention, where the device is applied to an amplified pixel structure. As seen from FIG. 3A, in accordance with the device of the present example, an amplification transistor 1, a reset transistor 2, a pixel selection transistor 3, a photodiode 5, a pixel selection signal line 11, a reset signal line 12, a signal line 13 (cf. FIG. 11), and a supply line 14 (cf. FIG. 11) a reprovided in association with each pixel. The same p well 110 as in the surrounding CMOS circuitry (FIG. 1) is formed under the transistors 1, 2, and 3, but not in a region underlying the photodiode 5. The regions 115 of the respective pixels in which the p well 110 is not formed are separated from or independent of one another, as can be more readily seen from FIG. 3B (a cross-sectional view taken along line A—A of FIG. 3A) and FIG. 3C (a cross-sectional view taken along line B—B of FIG. 3A). That is, the p well 110 is substantially absent under the n+ layer which is coupled to the transistor 3 (which includes a p well at least in its channel region). Accordingly, at least a portion of the n+ layer forming the photodiode section directly adjoins the low-concentration p- substrate 100.

Figure 3B:
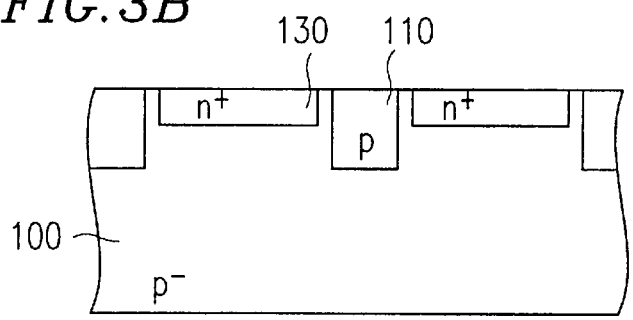
FIG. 3B shows a cross-sectional view taken along line A—A of FIG. 3A.
Figure 4:
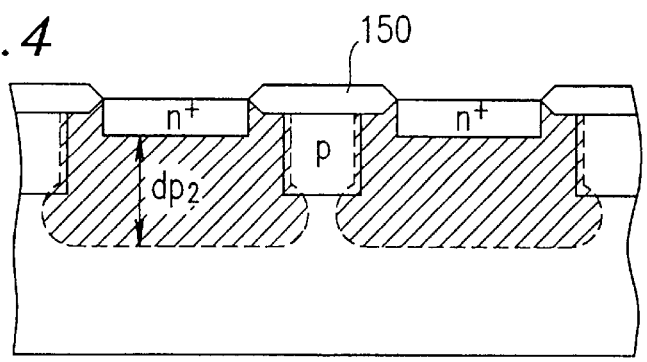
FIG. 4 shows a depletion layer in a pixel section of the imaging device of the present invention as shown in FIG. 3.

FIG. 4 is a more detailed cross-sectional view showing the cross section illustrated in FIG. 3B. It is assumed that a field oxide film 150 is formed by a LOCOS (local oxidation of silicon) process, which is a most commonly used device separation technique.

FIG. 4 assumes the following set of exemplary conditions (conditions (1)):

impurity concentration in the p- substrate $100=1\times10^{15}\text{cm}^{-3}$;

impurity concentration in the p well $110=1\times10^{17}\text{cm}^{-3}$;

impurity concentration in the n- layer $130=1\times10^{21}\text{cm}^{-3}$; and junction depth of the n+ layer $130=1.5\times10^{-5}\text{cm}$ Under conditions (1), assuming that the photodiode has a bias voltage of 3 V, the thickness $d_{p2}$ of the depletion layer will be calculated as follows:

$$d_{p2}=22.5\times10^{-5}\text{cm}.$$

Thus, the depletion layer has a thickness which is ten times as large as that obtained by forming a photodiode above the p well (where the thickness of the depletion layer=$2.3\times10^{-5}$cm), so that sufficient photoelectric conversion efficiency is secured at least within the visible spectrum. At the same time, since the amount of charge generated in a neutral region below the depletion layer is minimized, uncontrollable charge diffusion is minimized, which results in high resolution and low flare. Because of the thick depletion layer below the photodiode, the capacitance of the photodiode section is reduced to about 1/10 of that which results by forming the photodiode above the p well (assuming that the capacitance of the bottom side layers (e.g., the P well or the P- substrate in this case) is dominant). In other words, the charge-voltage conversion gain is increased tenfold.

In the examples illustrated in FIGS. 2A, 2B, and 2C, FIGS. 3A, 3B, and 3C, and 4, the region 115 underlying the photodiode where the p well is substantially absent extends slightly into a field oxide film lying outside the active region (indicated by a dot and dash line). However, the present invention is not limited to such configuration; the region 115 where the p well is substantially absent may extend only within the active region, for example, within the region where the n+ layer 130 exists.

EXAMPLE 2

Figure 5:
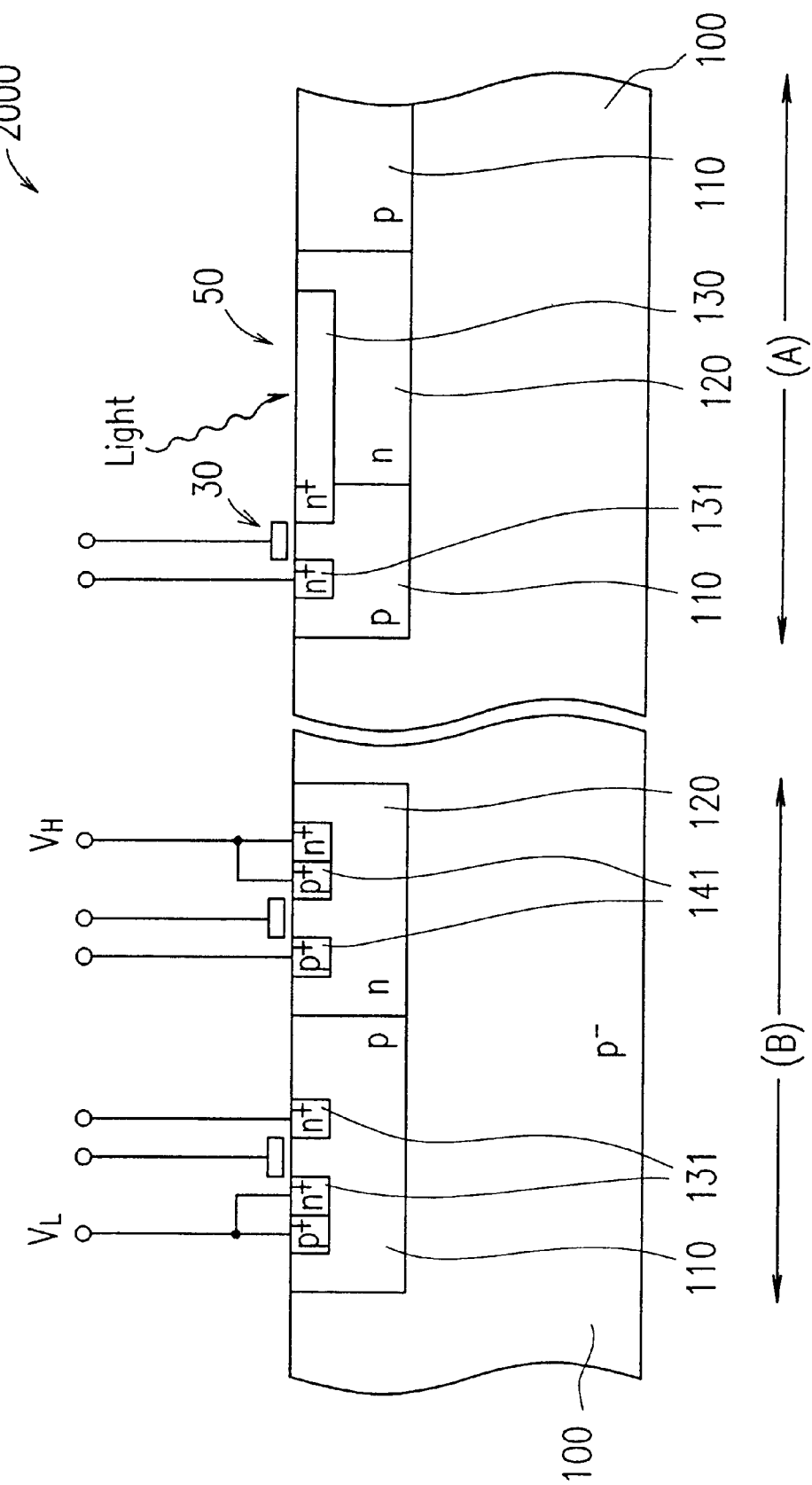
FIG. 5 is a cross-sectional view illustrating a CMOS type solid imaging device according to Example 2 of the present invention, showing in cross section a pixel section and surrounding CMOS circuitry.

FIG. 5 is a cross-sectional view illustrating a CMOS type solid imaging device 2000 according to Example 2 of the present invention, showing in cross section a pixel section and surrounding CMOS circuitry. The pixel section is labeled as (A), and the surrounding CMOS circuitry is labeled as (B). The component elements which also appear in FIG. 1 are indicated by the same reference numerals as used therein. The solid imaging device 2000 of the present example differs from the solid imaging device 1000 shown in FIG. 1 in that an n well 120 similar to the n well 120 of the twin well structure of the surrounding CMOS circuitry is provided under a photodiode section.

Specifically, in the pixel section (A) of the solid imaging device 2000 according to the present example, the p well 110 exists only under an n MOS transistor 30 (which controls the flow of a signal or charge from the photosensitive portion 50). That is, the p well 110 is substantially absent under the photosensitive portion 50 formed of the n+ layer 130.

Furthermore, an n well (intermediate layer) 120 having a lower impurity concentration than that of the n+ layer 130 is provided between the photosensitive portion 50 and a p- semiconductor substrate 100. Accordingly, a p-n junction for photoelectric conversion is formed between the p- semiconductor substrate 100 and a combination of the n+ layer 130 and the n well 120.

Furthermore, the n well 120 in the pixel section (A) and the n well 120 in the surrounding CMOS circuitry (B) can be formed in the same step (i.e., the same layer formation process).

Figure 2C:
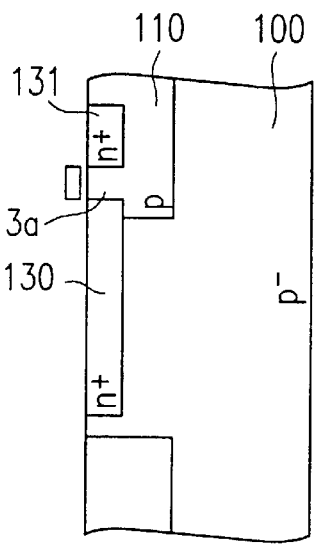
FIG. 2C shows a cross-sectional view taken along line B—B of FIG. 2A.
Figure 2B:
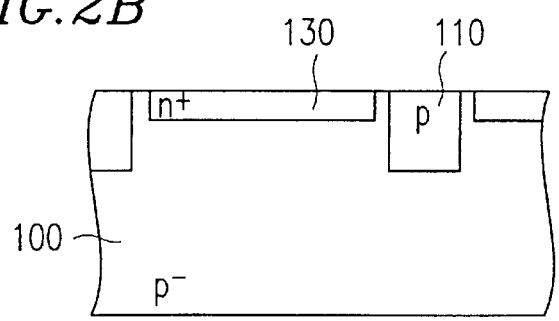
FIG. 2B shows a cross-sectional view taken along line A—A of FIG. 2A.
Figure 6A:
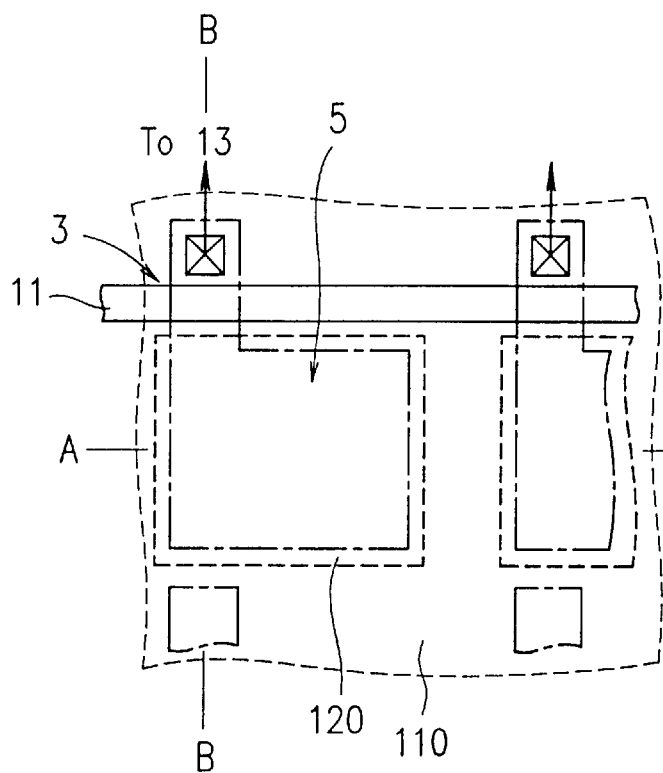
FIG. 6A shows a plan view of an actual pattern corresponding to a portion of a pixel section of the device according to Example 2 of the present invention, where the device is applied to a non-amplified pixel structure.
Figure 6C:
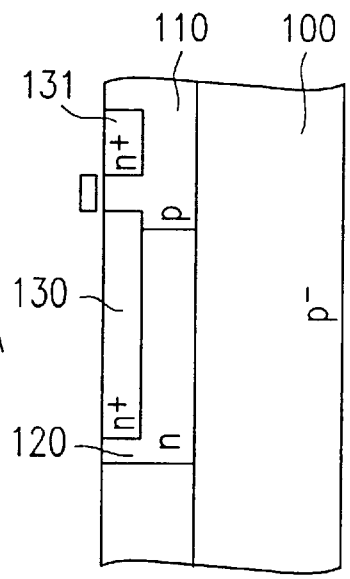
FIG. 6C shows a cross-sectional view taken along line B—B of FIG. 6A.
Figure 6B:
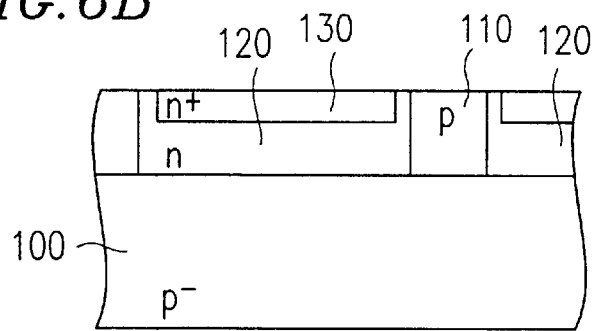
FIG. 6B shows a cross-sectional view taken along line A—A of FIG. 6A.

FIG. 6A shows a plan view of an actual pattern corresponding to a portion of a pixel section (virtually corresponding to two pixels) of the solid imaging device according to Example 2 of the present invention being applied to a non-amplified pixel structure as shown in FIG. 9. The component elements which also appear in FIGS. 2A, 2B, and 2C are indicated by the same reference numerals as used therein. As seen from FIG. 6A, in accordance with the device of the present example, the same p well 110 as in the surrounding CMOS circuitry (FIG. 1) is formed in the vicinity of the transistor 3 (or at least in the vicinity of the channel region thereof), and the same n well 120 as in the surrounding CMOS circuitry is formed under the photodiode 5. The n wells 120 are separated from pixel to pixel by the p wells 110, as can be more readily seen from FIG. 6B (a cross-sectional view taken along line A—A of FIG. 6A) and FIG. 6C (across-sectional view taken along line B—B of FIG. 6A). Specifically, the n well 120 is formed under the n+ layer 130 forming photodiode 5, so as to be surrounded by the p well 110. The transistor 3 is formed above the p well 110. As a result, the boundary between the n well 120 and the p well 110 is located slightly closer to the photodiode 5 and away from the transistor 3. It is desirable that the n well 120 extends slightly into a field oxide film lying outside the active region (indicated by a dot and dash line in FIG. 6A) for the reasons described later.

Figure 7A:
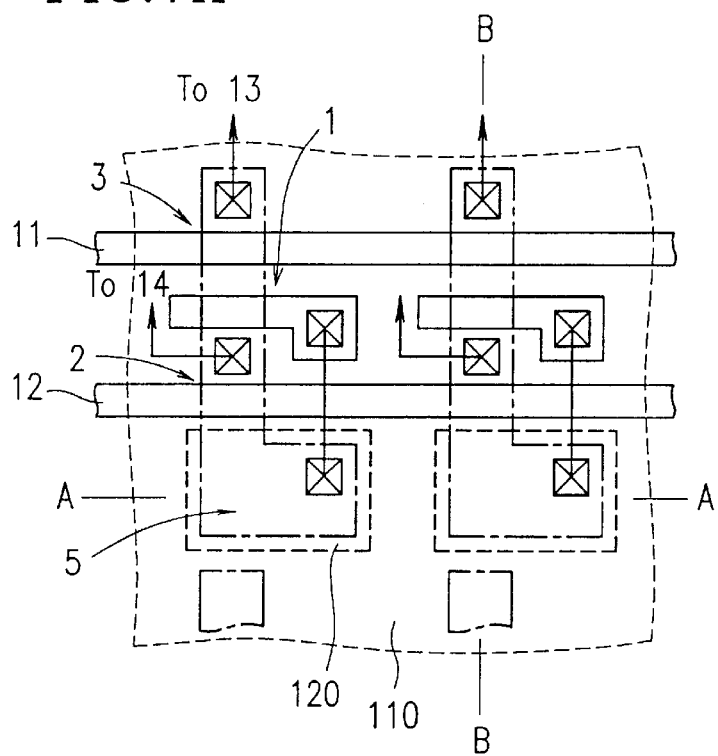
FIG. 7A shows a plan view of an actual pattern corresponding to a portion of a pixel section of the device according to Example 2 of the present invention, where the device is applied to an amplified pixel structure.
Figure 7C:
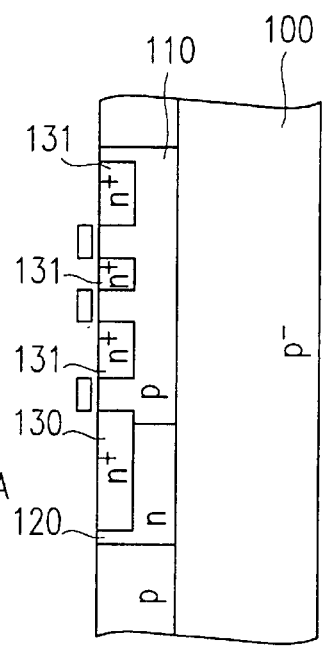
FIG. 7C shows a cross-sectional view taken along line B—B of FIG. 7A.
Figure 7B:
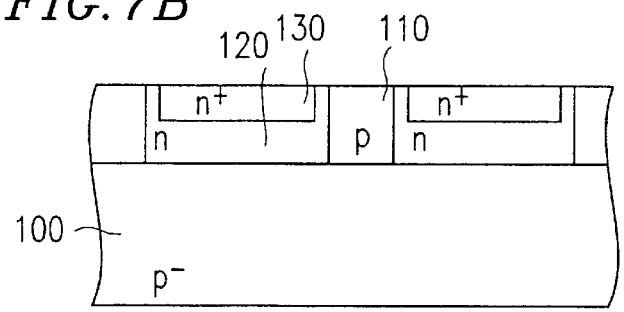
FIG. 7B shows a cross-sectional view taken along line A—A of FIG. 7A.
Figure 8:
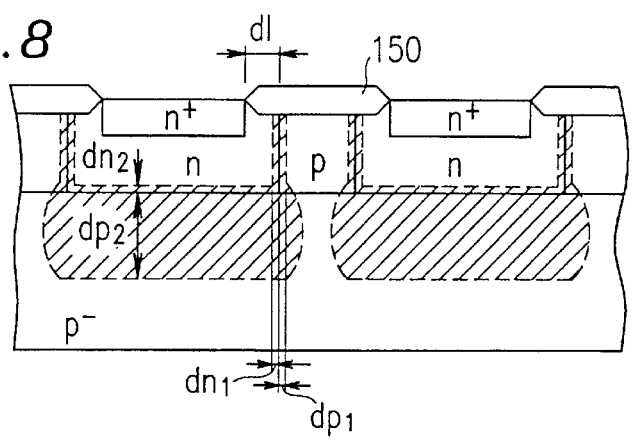
FIG. 8 shows a depletion layer in a pixel section of the imaging device of the present invention as shown in FIG. 7.

FIG. 7A shows a plan view of an actual pattern corresponding to a portion of a pixel section of the device according to Example 2 of the present invention, where the device is applied to an amplified pixel structure. The component elements which also appear in FIG. 3 are indicated by the same reference numerals as used therein. The solid imaging device of this example differs from the solid imaging device shown in FIG. 3 in that the same n well 120 as in the surrounding CMOS circuitry is formed under the photodiode 5. The n wells 120 are separated from pixel to pixel by the p wells 110, as can be more readily seen from FIG. 7B (a cross-sectional view taken along line A—A of FIG. 7A) and FIG. 7C (a cross-sectional view taken along line B—B of FIG. 7A). Specifically, the n well 120 is formed under the n+ layer 130 forming photodiode 5, so as to be surrounded by the p well 110. The boundary between the n well 120 and the p well 110 is located away from the transistor 2 which is adjacent the photodiode 5, so that the transistor 2 is in the p well 110. It is desirable that the n well 120 extends slightly into a field oxide film lying outside the active region (indicated by a dot and dash line in FIG. 7A) for the reasons described below:

FIG. 8 is a more detailed cross-sectional view showing the cross section illustrated in FIG. 7B. It is assumed that a field oxide film 150 is formed by a LOCOS process. FIG. 8 assumes the following set of exemplary conditions (conditions (2)):

impurity concentration in the p- substrate $100=1\times10^{15}$ cm$^{-3}$;

impurity concentration in the p well $110=1\times10^{17}$cm$^{-3}$;

impurity concentration in the n well $120=1\times10^{17}$cm$^{-3}$;

impurity concentration in the n+ layer $130=1\times10^{21}$cm$^{-3}$;

junction depth of the p/n wells=$1\times10^{-4}$cm; and junction depth of the n+ layer $130=1.5\times10^{-5}$cm Under conditions (2), assuming that the photodiode has a bias voltage of 3 V, the respective thicknesses of the depletion layers in various sections will be calculated as follows:

$$d_{n1}=1.6\times10^{-5}\text{cm}, d_{p1}=1.6\times10^{-5}\text{cm}.$$

$$d_{n2}=0.2\times10^{-5}\text{cm}, d_{p2}=22.4\times10^{-5}\text{cm}.$$

Herein, $d_{n1}$ and $d_{p1}$ represent the depths of portions of a depletion layer that lie within the n well layer 120 and the p well layer 110, respectively, the depletion layer being formed at the interface between the n well layer 120 and the p well layer 110. Similarly, $d_{n2}$ and $d_{p2}$ represent the depths of portions of a depletion layer that lie within the n well layer 120 and the p− substrate 100, respectively, the depletion layer being formed at the interface between the n well layer 120 and the p− substrate 100.

Thus, the lower end of the depletion layer is at a depth of about 3.2 μm (=junction depth of the n well+depth $d_{p2}$) from the semiconductor surface, so that sufficient photoelectric conversion efficiency is secured at least within the visible spectrum. At the same time, since the amount of charge generated below the depletion layer is minimized, the degradation of resolution and the flare phenomenon are greatly reduced. The junction capacitance of the photodiode section is reduced to about 1/10 of that which results by forming the photodiode above the p well (assuming that the capacitance of the bottom side layers is dominant). In other words, the charge-voltage conversion gain is increased tenfold.

It is believed that the boundary with the field oxide film in the periphery of the photodiode abounds with crystal defects. In the case where a depletion layer is formed at the boundary, a dark current may inevitably be generated. On the contrary, according to the present example of the invention (as shown in FIG. 8), the overlap d1 of the n well layer with the field oxide film can be prescribed at a value which is larger than the sum of $d_{n1}$ and the amount of bird's peak (e.g., 0.5 μm), e.g., about 1 μm. As result, the vicinity of bird's peak, where crystal defects are believed to concentrate, is occupied by a neutral region of the n layer 120, so that the generation of a dark current is effectively prevented. Thus, white defects or granular fixed pattern noises due to dark currents, which would otherwise degrade the display quality, are prevented.

As described above, in accordance with the solid imaging device of the present invention, the effective optical depth for photoelectric conversion can be increased due to a depletion layer having an increased depth, thereby greatly enhancing the photoelectric conversion efficiency. In the case of an amplified solid imaging device, in particular, the charge-voltage conversion efficiency can be improved due to the decreased photodiode capacitance. This and the enhanced photoelectric conversion efficiency together contribute to a great increase in sensitivity. In addition, the deeper depletion layer ensures that a major portion of the charges generated within each pixel stays within that pixel without being diffused into neighboring pixels. As a result, the resolution is improved and the flare phenomenon is minimized. Furthermore, the boundary with the field oxide film surrounding the photodiode (where the abundant crystal defects cause the generation of a dark current when a depletion layer is formed in the boundary) can be covered by a well neutral layer according to the present invention, thereby minimizing the generation of a dark current.

According to the present invention, a highly sensitive and high resolution solid imaging device having a low flare and a low dark current can be realized.

Since the solid imaging device according to the present invention can be produced using a standard CMOS process, it is easy to integrate the peripheral driving circuitry and/or signal processing portions; thus, the advantages of CMOS image sensors are well conserved in the solid imaging device according to the present invention.

In accordance with a CMOS type solid imaging device provided by the present invention, a plurality of pixels and twin well CMOS structures are provided on a semiconductor substrate. In a transistor section of each pixel, one of the two wells of the CMOS twin well structure has the same conductivity type as that of the substrate and a higher concentration than that of the substrate, such that the well is not formed under the photodiode section. As a result, the p-n junction for photoelectric conversion is directly formed on the substrate, thereby providing a very deep depletion layer inside the substrate.

In the case of forming a well having the opposite conductivity type from that of the substrate under the photodiode, a combination of the photodiode layer and the well layer defines a layer of the p-n junction for photoelectric conversion that lies closer to the substrate surface, thereby providing a much greater junction depth. Since the junction is formed directly on the low concentration substrate, a very deep depletion layer is provided inside the substrate.

By employing the above-described techniques, the effective optical depth can be greatly increased due to the enlarged depletion layer. As a result, the photoelectric conversion efficiency can be remarkably improved. In addition, a junction formed on a low concentration substrate greatly reduces the junction capacitance, and provides for a substantial potential variation per generated charge in the photodiode section, i.e., an increased charge-voltage conversion gain. This can further improve the sensitivity of an amplified solid imaging device, in particular.

Since a depletion layer is formed relatively deep into the substrate, it becomes possible to ensure that a major portion of the charges generated in each pixel region be gathered as a signal charge, without being diffused into the neighboring pixels. As a result, the resolution is improved and the flare phenomenon is effectively prevented.

The structure according to the present invention, which utilizes CMOS wells in the photodiode section, can be conveniently produced by using a standard CMOS process without any alteration.

Thus, according to the present invention, a highly sensitive and high resolution solid imaging device having a low flare can be provided by using a standard CMOS process without any alteration.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a solid state imaging device wherein the solid state imaging device comprises:

a semiconductor substrate of a first conductivity type;

a first layer to a second conductivity type formed on a surface of the semiconductor substrate, the first layer at least comprising a photosensitive portion of the second conductivity type;

a first MOS transistor of the second conductivity type coupled to the photosensitive portion; and CMOS circuitry for controlling a signal from the photosensitive portion, the CMOS circuitry comprising:

a first well of the first conductivity type having an impurity concentration different to that of the semiconductor substrate, and a second well of the second conductivity type, the first and second wells being formed on the semiconductor substrate of the first conductivity type;

a second MOS transistor of the second conductivity type formed on the first well of the first conductivity type; and a third transistor of the first conductivity type formed on the second well of the second conductivity type, the method comprising the steps of:

forming a third well of the first conductivity type having an impurity concentration which is higher than an impurity concentration of the semiconductor substrate in at least a channel region of the first MOS transistor coupled to the photosensitive portion, such that at least a portion of a boundary of the first layer of the second conductivity type is in direct contact with the semiconductor substrate and such that a region underlying the photodiode where the third well of the first conductivity type is substantially absent extends slightly into a field oxide film lying outside an active region; and forming the first well of the first conductivity type included in the CMOS circuitry and the third well of the first conductivity type provided in at least the channel region of the first transistor coupled to the photosensitive portion on a surface of the semiconductor substrate through a simultaneous layer formation process.

2. A method for producing a solid state imaging device wherein the solid state imaging device comprises:

a semiconductor substrate of a first conductivity type;

a first layer of a second conductivity type formed on a surface of the semiconductor substrate, the first layer at least comprising a photosensitive portion of the second conductivity type;

a first transistor of the second conductivity type coupled to the photosensitive portion; and CMOS circuitry for controlling a signal from the photosensitive portion, the CMOS circuitry comprising:

a first well of the first conductivity type and a second well of the second conductivity type, the first and second wells being formed on the semiconductor substrate of the first conductivity type;

a second transistor of the second conductivity type formed on the first well of the first conductivity type; and a third transistor of the first conductivity type formed on the second well of the second conductivity type, the method comprising the steps of:

forming a third well of the first conductivity type having an impurity concentration which is higher than an impurity concentration of the semiconductor substrate in at least a channel region of the first transistor coupled to the photosensitive portion, such that at least a portion of a boundary of the first layer of the second conductivity type is in direct contact with the semiconductor substrate; and forming the first well of the first conductivity type included in the CMOS circuitry and the third well of the first conductivity type provided in at least the channel region of the first transistor coupled to the photosensitive portion on a surface of the semiconductor substrate through a simultaneous layer formation process;

forming a fourth well of the second conductivity type having an impurity concentration which is lower than an impurity concentration of the photosensitive portion between the photosensitive portion and the semiconductor substrate, at least a portion of the fourth well of the second conductivity type being in direct contact with the semiconductor substrate; and forming the second well of the second conductivity type included in the CMOS circuitry and the fourth well of the second conductivity type provided between the photosensitive portion and the semiconductor substrate on the surface of the semiconductor substrate through a simultaneous layer formation process.

* * * * *